United States Patent [19]
Dietz

[11] 4,362,974
[45] Dec. 7, 1982

[54] COMMUTATED SWITCHED REGULATOR WITH LINE ISOLATION FOR TRANSISTOR DEFLECTION

[75] Inventor: Wolfgang F. W. Dietz, New Hope, Pa.

[73] Assignee: RCA Corporation, New York, N.Y.

[21] Appl. No.: 187,275

[22] Filed: Sep. 15, 1980

Related U.S. Application Data

[63] Continuation of Ser. No. 19,581, Mar. 12, 1979, abandoned.

[51] Int. Cl.³ ............................................ H01J 29/70
[52] U.S. Cl. .................................. 315/408; 315/411
[58] Field of Search ................................ 315/408, 411

[56] References Cited

U.S. PATENT DOCUMENTS

| | | | |
|---|---|---|---|
| 3,999,102 | 12/1976 | Gent et al. | 315/408 X |
| 4,034,262 | 7/1977 | Dietz | 315/408 |
| 4,037,137 | 7/1977 | Dietz | 315/408 X |
| 4,143,306 | 3/1979 | Shepherd | 315/408 |
| 4,146,823 | 3/1979 | Dietz | 315/408 |

FOREIGN PATENT DOCUMENTS

| | | |
|---|---|---|
| 2027840 | 12/1971 | Fed. Rep. of Germany . |
| 2712053 | 9/1978 | Fed. Rep. of Germany ...... 315/408 |
| 2835946 | 2/1979 | Fed. Rep. of Germany . |

OTHER PUBLICATIONS

"Comparison of Transistor and SCR Deflection Circuits for Color Television", by Dietz et al., IEEE Transactions on Consumer Electronics, vol. CE-22, No. 4, pp. 357-366, Nov. 1976.

*Primary Examiner*—Malcolm F. Hubler
*Attorney, Agent, or Firm*—E. M. Whitacre; P. J. Rasmussen; Joseph Laks

[57] ABSTRACT

A transistor horizontal deflection circuit is energized from a source of unregulated direct voltage derived from the power mains but is conductively isolated therefrom. A switching voltage regulator couples the direct voltage source to the horizontal deflection circuit. The regulator includes a controllable switch serially coupled with the primary winding of a transformer and the source. The switch is controlled to maintain a constant voltage or energy level in the horizontal deflection circuit. A secondary winding conductively isolated from the primary is coupled across the deflection winding for forming a path for bidirectional current flow. The horizontal output transistor is coupled in parallel with the deflection winding for producing retrace pulses which are coupled to the primary winding for reducing the current in the controllable switch to zero during the retrace interval.

16 Claims, 4 Drawing Figures

COMMUTATED SWITCHED REGULATOR WITH LINE ISOLATION FOR TRANSISTOR DEFLECTION

This is a continuation, of application Ser. No. 019,581, filed Mar. 12, 1979, now abandoned.

BACKGROUND OF THE INVENTION

This invention relates to switching regulators having the regulator switch commutated into nonconduction for energizing television horizontal deflection circuits while maintaining the horizontal deflection circuit isolated from the power line.

Horizontal deflection circuits are used in conjunction with television picture tubes in television display devices. Typically, the horizontal deflection circuit includes a magnetic winding associated with the picture tube and a switching circuit by which energy from a direct voltage source is coupled to the winding and to its associated reactances. The switching circuit is synchronized with synchronizing signals associated with the information content of the video to be displayed on the picture tube. In order to avoid distorted images on the displayed raster, the size of the horizontal scanning line and the peak deflection or scanning current must be maintained constant over substantial periods of time.

Many conditions can cause the size of the horizontal scanning line to vary. If the direct energizing voltage for the horizontal deflection circuit varies, the scanning energy and hence the width of the horizontal scanning line may vary. It has in the past been customary to regulate the direct voltage applied to the horizontal deflection circuit by the use of a dissipative regulator. Requirements for low power consumption in television receivers are reducing the use of such dissipative regulators in favor of nondissipative or switching types.

Among the switching regulators for use with television deflection circuits are reverse-current regulators, so called because energy in excess of the maximum required by the deflection circuit flows from the regulator to the deflection circuit during a portion of the deflection interval. Regulation is accomplished by variable control of the energy flowing back to the unregulated direct-current source. Such a regulator is described in U.S. Pat. No. 4,013,923 issued Mar. 22, 1977 to den Hollander. When used with an SCR deflection system as illustrated in the den Hollander patent, regulation occurs during the interval in which the commutating switch is open or nonconductive. This interval has a duration of approximately 38 μsec., representing more than half of the 63 μsec. horizontal deflection interval. The reverse-current regulation scheme cannot be conveniently adapted for use with transistor horizontal deflection systems, because only the relatively short retrace interval is available for the regulating action to take place, and also because gating of the return-current switch changes the impedance of the source and adversely affects retrace time.

Forward-current regulators as illustrated by U.S. Pat. No. 4,002,965 issued Jan. 11, 1977 to den Hollander can provide conductive isolation when used in conjunction with a transistor deflection circuit. However, such arrangements require either high-voltage regulator switches or diodes to prevent the application of excessive reverse voltage to the regulator switch during the retrace interval. Also, the gating time variation required to maintain a constant output voltage under conditions of line and load variation is relatively great, thereby limiting the correction range.

A forward-current regulator having a bidirectional regulator switch as described in U.S. Pat. No. 4,071,810 issued Jan. 31, 1978 to Dobbert when used in conjunction with an SCR deflection circuit provides galvanic or conductive isolation between the power source and the deflection circuit and has limited reverse voltage across the regulator switch, but requires a separate controlled resonant circuit to allow the regulator switch to become nonconductive.

It is desirable to have a regulator scheme adaptable for use with a transistor deflection circuit which provides conductive isolation from the power mains, has no substantial voltage across the regulator switch during the retrace interval, a wide range of regulation, and which is commutated off and therefore has relatively small losses and which requires no independent turn-off circuit, or in which turn-off transients are small if a turn-off circuit is used.

SUMMARY OF THE INVENTION

A regulated television deflection apparatus adapted to be energized by and isolated from a source of unregulated direct voltage includes a regulator switch having a controlled current path and a control electrode. A transformer has a primary winding serially coupled with the main current path and with the source of direct voltage for coupling energy from the source to the primary winding during those intervals in which the regulator switch is on. The transformer has a secondary winding conductively isolated from the primary winding. A deflection winding is coupled across the secondary winding for forming a path for the bidirectional flow of current therebetween. A trace switch is coupled in parallel with the deflection winding and is operated at the horizontal rate for promoting the flow of deflection current in the deflection winding during recurrent trace and retrace intervals. The voltage across the deflection winding during the retrace interval is coupled to the primary winding for reducing the current in the main current path to zero during the retrace intervals to turn the regulator switch off. A control circuit is coupled to the control electrode for controlling the time during the trace interval at which the regulator switch is turned on for maintaining the voltage or energy level associated with the deflection circuit at a substantially constant amplitude.

DESCRIPTION OF THE INVENTION

Figure 1:
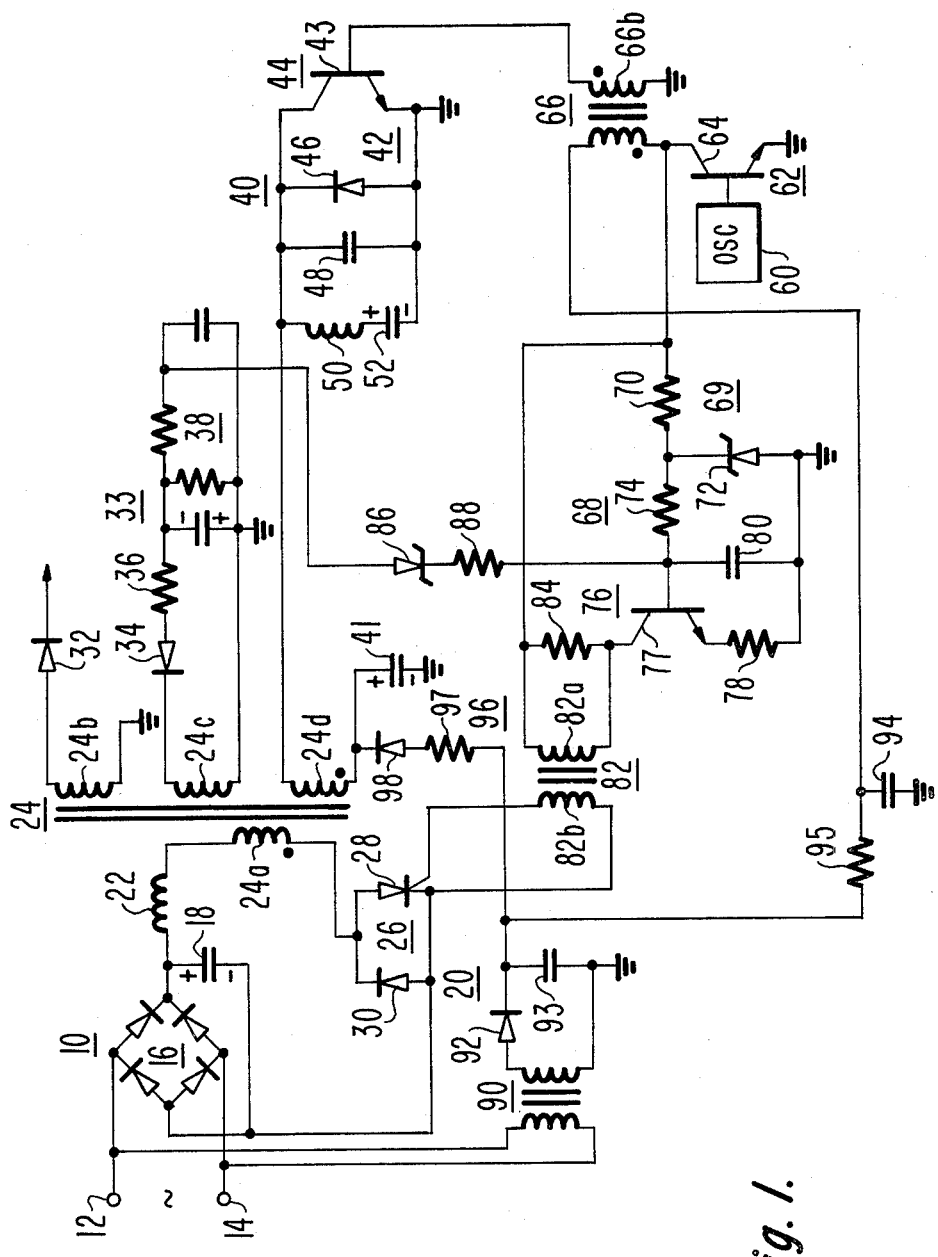
FIGS. 1 and 3 illustrate in block and schematic diagram form the regulated deflection portions of television arrangements embodying the invention.

At upper left of FIG. 1, a direct voltage power supply designated generally as 10 has terminals 12 and 14 adapted to be coupled to the power mains or other source of alternating voltage, not shown. A full-wave bridge rectifier 16 is coupled to terminals 12 and 14. A filter capacitor 18 is coupled to bridge rectifier 16 in known fashion for filtering pulsating direct current to produce an unregulated direct voltage. The direct voltage is applied to a regulator circuit designated generally as 20. Regulator circuit 20 includes the series combination of an inductor or winding 22, the primary winding 24a of a transformer 24, and a bidirectional switch 26. The series combination is coupled across capacitor 18. Switch 26 includes an SCR or thyristor 28 antiparalleled with a diode 30.

A high alternating voltage is generated at a secondary winding 24b of transformer 24. The high voltage is rectified by a rectifier represented as a diode 32, and the high voltage is coupled from the cathode of diode 32 to the ultor of a kinescope, not shown. A further secondary winding 24c of transformer 24 is coupled to a reference voltage generating circuit 33. Current flows from winding 24c by way of a diode 34 and a resistor 36 to a resistance-capacitance filter designated generally as 38 for generating a direct voltage related to the magnitude of the energy circulating in the system. This direct voltage is used as a reference to control the regulator.

A horizontal deflection circuit designated generally as 40 is coupled to one end of a secondary winding 24d of transformer 24. The other end of winding 24d is coupled to ground by a filter capacitor 41. Horizontal deflection circuit 40 includes a trace switch 42 formed by an NPN horizontal output transistor 44, the emitter of which is coupled to ground, and a damper diode 46 having its cathode connected to the collector of transistor 42 and its anode connected to ground. A retrace capacitor 48 and the serial combination of a deflection winding 50 and S-shaping capacitor 52 are coupled in parallel with switch 42. Deflection circuit 40 is energized by power coupled through transformer 24 and stored in capacitor 41.

A source of horizontal-frequency synchronizing signals such as oscillator 60 at the bottom of FIG. 1 is coupled to the base of an NPN driver transistor 62, the emitter of which is coupled to ground. The collector 64 of transistor 62 is coupled to base 43 of transistor 44 by means of a transformer 66. The collector 64 of driver transistor 62 also drives a regulator control circuit designated generally as 68. Control circuit 68 includes a shunt regulator 69 consisting of the serial combination of a resistor 70 and a zener diode 72 connected between the collector of transistor 64 and ground. A charging resistor 74 couples the output of shunt regulator 69 to one end of a charging capacitor 80, the other end of which is coupled to ground. The base-emitter junction of a transistor 76 is serially coupled with a stabilizing resistor 78 across capacitor 80.

The collector 77 of transistor 76 is coupled to one end of the primary winding 82a of an isolation transformer 82, and the other end of winding 82a is connected to collector 64. A damper resistor 84 is coupled across winding 82a. The secondary winding 82b of transformer 82 is coupled across the gate and cathode terminals of SCR 28. The control circuit is made responsive to the energy circulating in the regulated deflection system by the series combination of a zener diode 86 and a resistor 88 coupled between the base of transistor 76 and filter 38. Energizing voltage for driver transistor 62 and control circuit 68 is obtained from a power supply including a transformer 90, the primary winding of which is coupled to terminals 12 and 14 and the secondary of which is coupled to a rectifier diode 92, and to a filter including capacitors 93 and 94 and a resistor 95. A start-up circuit 96 including a resistor 97 and a diode 98 is coupled between capacitor 93 and capacitor 41 for providing operating voltage for horizontal output stage 40 at initial turn-on.

Generally, the arrangement of FIG. 1 couples energy from power supply 10 to deflection circuit 40 through transformer 24, thereby providing conductive isolation between the power mains and ground. Horizontal deflection circuit 40 is driven at the horizontal rate, and SCR 28 is gated with pulse-time modulated signals at the same rate to control the deflection magnitude and/or the ultor voltage. SCR 28 is commutated off by the horizontal retrace pulse coupled back from deflection circuit 40 through transformer 24. After the initial turn-on interval, start-up circuit 96 is decoupled by diode 98 from deflection circuit 40 by the increase in direct voltage across capacitor 41 resulting from rectification by trace switch 42 of the alternating current produced by winding 24d.

Figure 2:
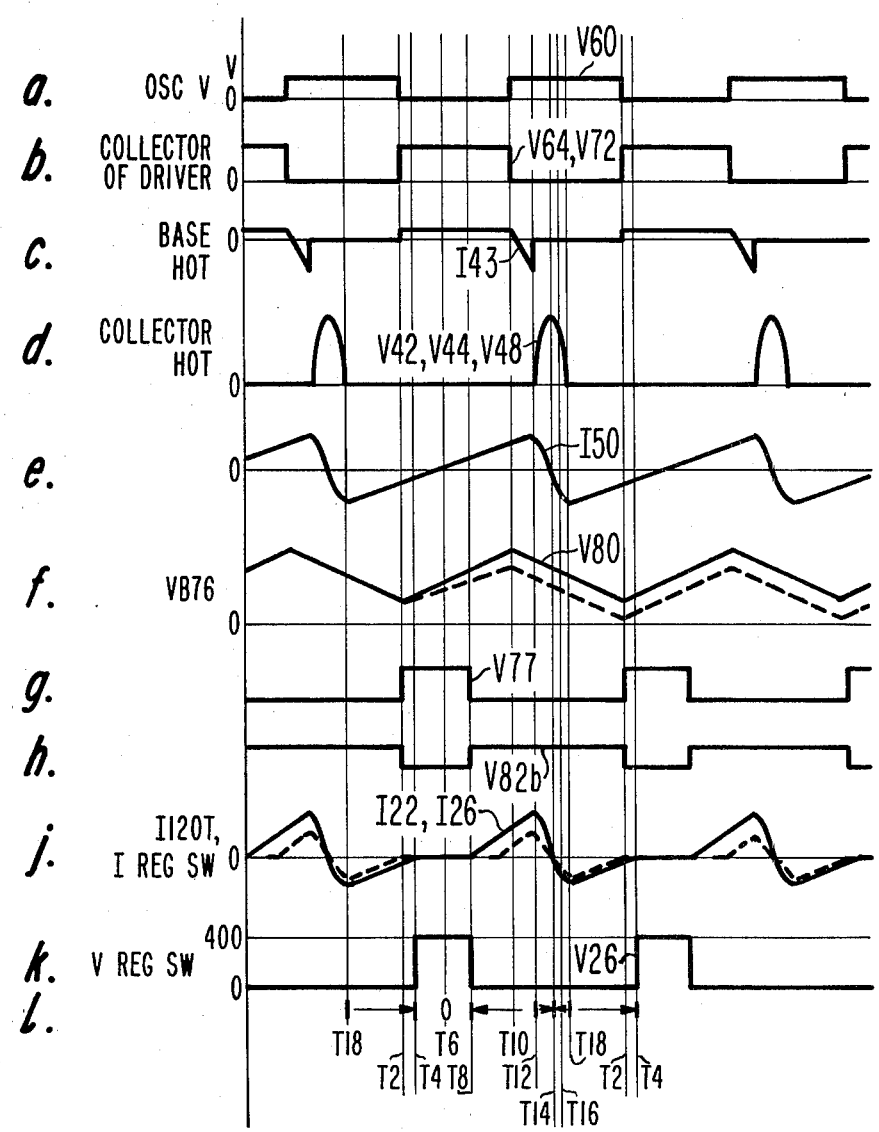
FIGS. 2 and 4 are amplitude-time plots or waveforms of electrical quantities associated with the arrangements of FIGS. 1 and 3, respectively.

In operation immediately before time T2 as shown in FIG. 2, transistor 62 is conducting, horizontal output transistor 44 is nonconducting and damper diode 46 conducts a decreasing current flow through inductor 50 and capacitor 52 as inductor 50 gives up energy to capacitor 52. Diode 30 of regulator switch 26 also conducts a decreasing current I26 of FIG. 2j as energy stored in the form of current in inductor 22 is transferred to capacitor 18 and, by way of transformer 24, to capacitor 41. With diode 30 conductive, the voltages across regulator switch 26 and trace switch 42 are substantially zero as shown by V26 of FIG. 2k and by V42 of FIG. 2d, respectively. SCR 28 and transistor 44 are slightly reverse-biased and therefore nonconducting. Transistor 76 lacks collector bias and is nonconductive, and capacitor 80 has a voltage thereacross less than the base-emitter offset voltage VB76 of transistor 76, and is discharging as illustrated by V80 of FIG. 2f through resistor 88 and zener diode 86.

At time T2, drive voltage V60 produced by oscillator 60 makes a negative transition, as illustrated in FIG. 2a, and transistor 62 is thereby rendered nonconductive. The energy stored in the leakage inductance of transformer 66 produces a positive pulse voltage at collector 64, as illustrated by V64 of FIG. 2b, and also at base 43 of transistor 44, which results in a forward base current as illustrated by I43 of FIG. 2c. Transistor 44 is thus made conductive before the time T6 at which the current I50 in deflection winding 50 reaches zero as illustrated in FIG. 2e. In the interval T2-T10, the positive voltage V64 at the collector of transistor 62 produces a positive voltage across zener diode 72 as illustrated by V72 in FIG. 2b. The positive voltage across zener 72 allows current to flow through resistor 74, offsetting the discharging current through resistor 88 and creating a positive-going ramp voltage across capacitor 80, as illustrated by V80 of FIG. 2f. Transistor 76 remains nonconductive after T2, however, until a later time T8 at which increasing ramp voltage V80 reaches the base-emitter offset voltage VB76 of transistor 76.

The switching of transistor 62 at time T2 does not affect the transfer of energy from inductor 22 to supply 10 and to capacitor 41. Energy continues to be transferred in this manner until a later time T4. At a time T4, the energy associated with the magnetic field of inductor 22 is exhausted, and current ceases to flow in the circular path through inductor 22, diode 30 and winding 24a. Diode 30 becomes nonconductive, and regulator switch 26 opens. In the absence of current flow in inductor 22 or in winding 24a, the voltage across regulator switch 26 rises to equal the unregulated voltage then appearing across capacitor 18, as illustrated by V26 in the interval after time T4 in FIG. 2k. SCR 28 remains nonconductive, although forward-biased, until a later time T8, at which time a gating pulse once again renders it conductive. No energy is transferred between inductor 22 and deflection circuit 40 during the interval T4-T8 in which regulator switch 26 is open.

In the interval between times T4 and T6, the current flowing in the circular path including deflection winding 50, capacitor 52 and damper diode 46 decreases towards zero, and at time T6 the current reaches zero and diode 46 becomes nonconductive. Transistor 44 becomes conductive prior to time T6, as mentioned, and current begins to flow at time T6 through winding 50 and transistor 44 under the impetus of the voltage across capacitor 52, as illustrated by I50 of FIG. 2e. However, current does not flow in the interval T4-T8 from capacitor 41 through winding 24d to ground through transistor 44, because winding 24d is coupled to winding 24a, which is open-circuited by open switch 26.

In the interval between times T6 and T8, ramp voltage V80 continues to increase at a rate determined by zener diode 72, resistor 74, resistor 88, zener diode 86 and the voltage stored on filter 38. SCR 28 remains nonconductive, though forward-biased. At time T8, ramp voltage V80 becomes equal to the base-emitter offset voltage of transistor 76 and transistor 76 becomes conductive. With transistor 76 conductive, voltage V77 at the collector of transistor 76 makes a negative transition, as illustrated in FIG. 2g, and a gating pulse is applied to SCR 28 as illustrated by V82b of FIG. 2h. At time T8, SCR 28 is rendered conductive and regulator switch 26 is closed. The voltage across regulator switch 26 decreases to zero as illustrated by V26 of FIG. 2k. With switch 26 closed in the interval T8-T12, a complete series circuit is formed between supply capacitor 18, inductor 22, and transformer winding 24a. The effective impedance across secondary winding 24d drops, and conventional current flows upwards through winding 24d under the impetus of the voltage across capacitor 41. Due to the poling of transformer 24, this results in a voltage across primary winding 24a which increases the voltage applied across inductor 22, i.e., the voltage then across winding 24a aids the unregulated direct voltage in promoting the flow of current in inductor 22. Thus, in the interval T8-T12, energy is transferred from deflection circuit 40 to winding 22.

In the interval T8-T10, output voltage V60 of oscillator 60 remains low and transistor 62 remains nonconductive. Collector voltage V64 of transistor 62 remains high as does voltage V72 across zener 72. Ramp voltage V80 and ramp current I50 continue to increase. At time T10, oscillator 60 produces a positive transition, and transistor 62 becomes conductive. This produces a negative-going transition in the voltage applied to base 43 of output transistor 44, and the removal of charge carriers from the base region of transistor 44 begins, as illustrated by I43 of FIG. 2c.

The negative-going transition of voltage V64 at the collector of transistor 62 at time T10 also removes drive from zener 72 and removes the supply voltage available at the collector 77 of transistor 76. Voltage V77 is therefore maintained at zero by the removal of collector drive regardless of the base voltage. Capacitor 80 continues to discharge through resistor 88 and zener diode 86 after time T10, but discharges through resistor 70 and 74 to the low voltage at collector 64 rather than being charged therethrough. Thus voltage V80 becomes a ramp having a negative slope. At a time T16 illustratively occurring during the retrace interval, but which may be during the trace interval, decreasing ramp voltage V80 becomes equal to and less than the base-emitter offset voltage VB76 of transistor 76. However, no transition occurs in voltage V77 at the collector of transistor 76, because supply voltage V64 for transistor 77 is zero at this time. Thus, V77 cannot make a transition until V64 once again becomes positive.

In the interval T10-T12 just before the beginning of the retrace interval, charge carriers continue to be removed from base 43 as illustrated by I43 and transistor 44 remains conductive, as indicated by the low voltage V44 thereacross in FIG. 2d. The collector current of transistor 44 continues to increase as deflection current I50 increases. Current continues to increase in inductor 22 as energy is transferred thereto from the unregulated source and from capacitor 41, and SCR 28 of regulator switch 26 remains closed.

At time T12, the charge carriers in the base region of transistor 44 are exhausted, and the base current decreases to zero as illustrated by I43, even though the reverse-bias voltage applied to the base continues. Transistor 44 becomes nonconductive, and the currents then flowing in deflection winding 50 and in winding 24d begin to flow into retrace capacitor 48 to initiate the retrace interval. The voltage across capacitor 48 increases until it equals the voltage across capacitor 41, and continues to rise. When the voltage across capacitor 48 exceeds the voltage across capacitor 41, the voltage applied across secondary winding 24d is reversed in polarity from that in the trace interval. The reversed voltage appears across primary winding 24a, begins to oppose the flow of current in inductor 22, rather than aiding. The energy associated with the magnetic field of inductor 22 forces current to continue to flow into the opposing voltage generated at winding 24a. Thus, slightly after time T12 at which the retrace interval begins, the energy stored in winding 22 begins to be transferred to retrace capacitor 48 by way of secondary winding 24d.

During the first half T12-T14 of the retrace interval, deflection winding 50 and inductor 22 transfer substantially all of their energy to capacitor 48 as currents I50 and I26 decrease towards zero. At time T14, capacitor 48 reaches its maximum retrace voltage as illustrated by V48 in FIG. 2d and current in winding 50 and inductor 22 reaches zero. When the current in switch 26 reaches zero, SCR 28 becomes nonconductive. Immediately after time T14, the current in deflection winding 50, and also in inductor 22 and switch 26, begins to increase in the reverse direction. The current in switch 26 flows through diode 30, thereby slightly reverse-biasing SCR 28. As the current increases, the retrace voltage across transistor 44 and retrace capacitor 48 decreases.

During the second half of the retrace interval extending from time T14 to T18, energy is transferred from capacitor 48 to capacitor 42 by means of current flow through winding 24d.

In this same interval, energy is coupled from winding 24d to winding 24a and is transferred to inductor 22 and to unregulated supply 10. Just before time T18, the voltage across retrace capacitor 48 becomes equal to and decreases below the voltage then on capacitor 41, whereupon the voltage across winding 24d and therefore across winding 24a become reversed from that which existed during the principal part of the retrace interval. Thus, near time T18 of the end of the retrace interval, the transfer of energy from deflection circuit 40 to inductor 22 ends, and energy begins once again to be transferred from inductor 22 back to deflection circuit 40, as well as to unregulated source 10.

At time T18 the voltage across capacitor 48 decreases to a slightly negative value, diode 46 becomes conductive and the retrace interval ends. A current of decreasing magnitude forming a ramp of current continues to flow through deflection winding 50 and damper diode 46, and inductor 22 continues to transfer energy to unregulated supply 10 and by way of transformer 24 to capacitor 41, and the cycle begins again.

As described, the arrangement of FIG. 1 transfers energy to the horizontal deflection circuit through a path including transformer 24 which is bidirectional for both current and instantaneous power flow. The instantaneous direction of power flow during relevant portions of each cycle is illustrated in FIG. 2 by arrows. Bidirectional switch 26 is commutated into nonconduction by reducing the voltage thereacross to zero, and because the switch is didirectional, the maximum voltage thereacross during the retrace interval does not exceed the unregulated B+. Since switch 26 is commutated, there are no switching losses as occurs in regulators during the turn-off intervals, and the efficiency is therefore high.

Figure 3:
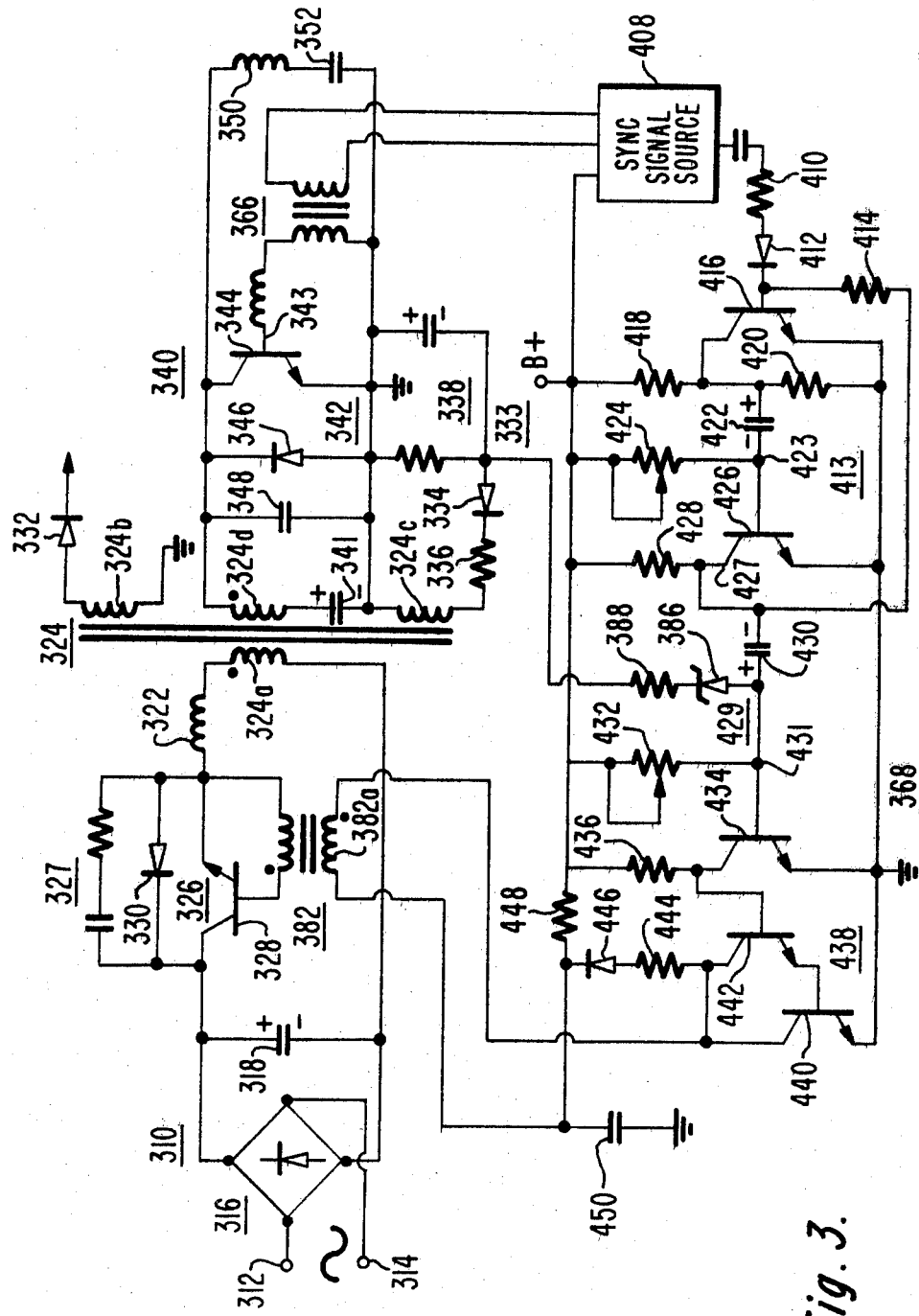

It has been observed that a rapid increase in the unregulated B+ in the arrangement of FIG. 1 may create a situation in which regulator switch 26 does not turn off during the retrace interval. It is believed that this results from an increase in the amount of energy stored in inductor 22 without a corresponding increase in the energy of the retrace pulse. FIG. 3 illustrates an arrangement using a transistor for the regulator switch. In the arrangement of FIG. 3, the regulator switch is commutated off in normal operation, thereby providing all the advantages described in conjunction with the arrangement of FIG. 1. In the event that the regulator switch should not be turned off by the retrace pulse during the retrace interval, the transistor is turned off by the control circuit, thereby providing positive control.

In FIG. 3, elements corresponding to those of FIG. 1 have the same reference number in the 300 series. In FIG. 3, alternating current applied to input terminals 312 and 314 and rectified by bridge rectifier 316 produces unregulated direct voltage across filter capacitor 318. Regulator switch 326 is coupled in series with inductor 322 and primary winding 324a of transformer 324. Switch 326 includes an NPN transistor 328 having its collector coupled to the positive terminal of the unregulated source. A diode 330 has its cathode connected to the collector of transistor 328 and its anode connected to the emitter. A snubbing circuit 327 is coupled in parallel with diode 330.

Ultor winding 324b and rectifier 332 produce ultor voltage for a kinescope, not shown. Deflection circuit 340 corresponds closely with circuit 40 of FIG. 1, as does reference voltage generating circuit 333 for generating a direct voltage representative of the energy circulating in the system. Control circuit 368, however, is arranged to take into account the different drive requirements of transistor 328 as compared with SCR 28. A synchronized signal source illustrated as a block 408 has an output coupled to a drive transformer 366 for driving base 343 of horizontal output transistor 344. Another output of synchronized signal source 408 is coupled through a resistor 410 and a diode 412 to a timing circuit designated generally as 413. Circuit 413 includes an NPN transistor 416 connected as a common-emitter amplifier with its base connected to diode 412. The collector of transistor 416 is coupled to B+ by a resistor 418, to ground by a resistor 420 and to the base of an NPN transistor 426 by a capacitor 422. The base of transistor 426 is coupled to B+ by means of adjustable resistor 424. Transistor 426 is connected in the common-emitter or inverting configuration, and its collector 427 is coupled to B+ by a load resistor 428 and back to the base of transistor 416 by a feedback resistor 414. Timing circuit 413 accepts a positive-going pulse from source 408 and produces a negative-going transition at collector 427 at a time delayed under control of resistor 424 for establishing the turn-off time of regulator transistor 328.

A second timing circuit 429 includes a capacitor 430 serially coupled at a point 431 with an adjustable resistor 432 between B+ and the output point 427 of timing circuit 413. The base-emitter junction of a transistor 434 is coupled between circuit point 431 and ground. The collector of transistor 434 is coupled to B+ by way of a resistor 436. A Darlington transistor circuit 438 including NPN transistors 440 and 442 has its equivalent emitter coupled to ground and its equivalent base coupled to the collector of transistor 434. One end of the primary winding 382a of an isolating transformer 382 is coupled to the collector of Darlington circuit 438. The other end of winding 382a is coupled to B+ by an isolating resistor 448 and is also coupled to ground by a capacitor 450. A damping circuit including a resistor 444 and a diode 446 is coupled across winding 382a. The secondary winding of transformer 382 is coupled across the base-emitter junction of regulator transistor 328. Control circuit 368 is made responsive to the total energy circulating in the deflection system by means of a zener diode 386 and a resistor 388 serially coupled between circuit point 431 and reference voltage generating circuit 333.

In operation, delay circuit 413 is adjusted so as to initiate the turn-off portion of the drive pulse to the base of transistor 328 during the second half of the retrace interval. Thus, if the retrace pulse does not commutate switch 326 into nonconduction, as may occur due to a rapid increase in the unregulated supply voltage, the control circuit will turn transistor 328 off to guarantee operation without excessive energy storage. Timing circuit 429 is adjusted by means of resistor 432 to provide a proper amount of circulating energy by controlling the relative turn-ON time of regulator transistor 328.

Figure 4:
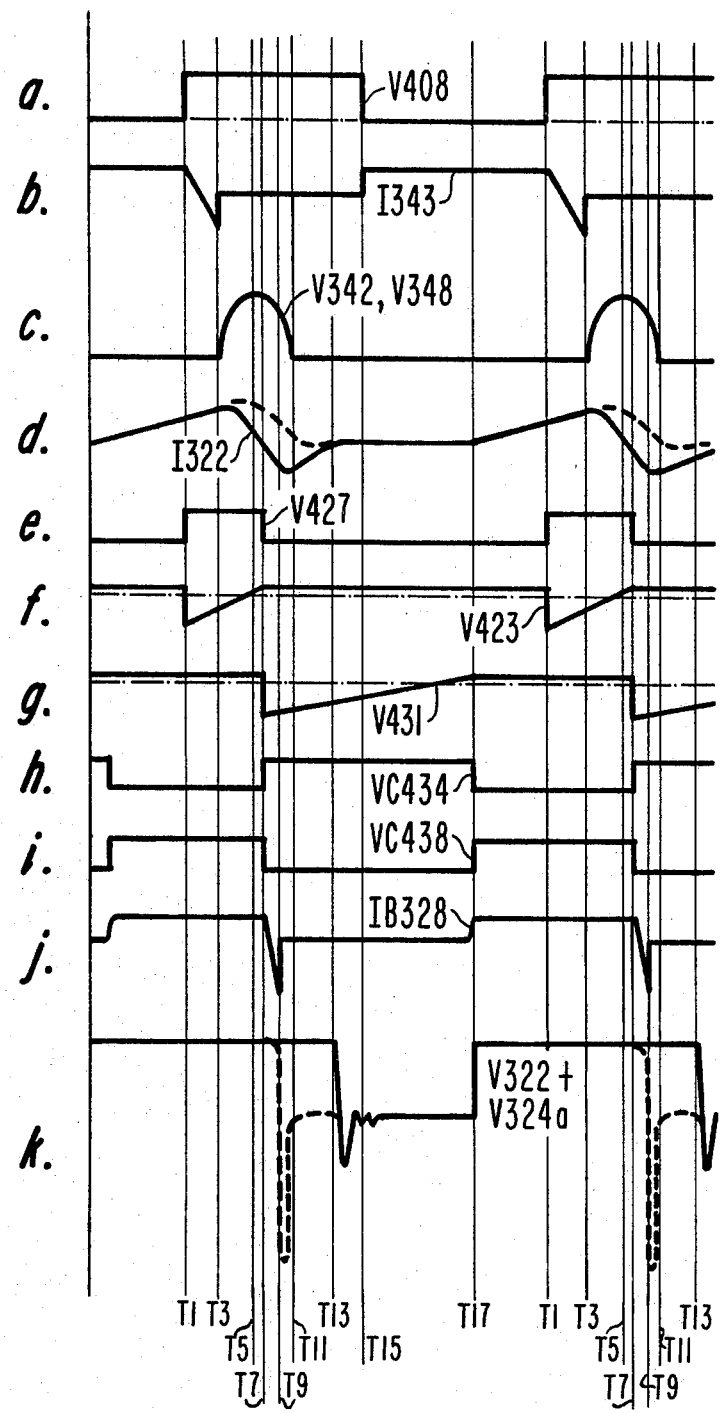

Immediately before time T1 as illustrated in FIG. 4, the output of synchronizing signal source 408 is low, and output transistor 344 is forward-biased and conducts a decreasing current in a circular path through capacitor 352 and winding 350. Also immediately prior to time T1, regulator switch 326 is conductive, and an increasing current flows through inductor 322 and through transformer winding 324a under the impetus of the unregulated direct voltage as illustrated by I322 of FIG. 4d. Transistors 426, and 442 are conductive and transistors 416 and 434 are nonconductive. Circuit point 423 is slightly positive with respect to ground by the base-emitter offset voltage of transistor 426, and capacitor 422 is charged in the polarity shown.

At time T1, a positive transition occurs in the output of source 408 as illustrated by V408 of FIG. 4a. The transition begins the extraction of charge carriers from the base region of horizontal output transistor 344 as illustrated by I343 of FIG. 4b. The transition also turns transistor 416 on, creating a negative-going transition voltage at its collector. This transition is coupled to circuit point 423 as illustrated by V423 of FIG. 4f. Transistor 427 becomes nonconductive, and its collector voltage rises as illustrated by V427 of FIG. 4e. The positive transition is coupled back to the base of transistor 416 through feedback resistor 414 to maintain transistor 416 conductive.

In the interval between times T1 and T3, charge carriers continue to be extracted from the base region of transistor 344 as illustrated by I343 of FIG. 46. Also in the interval T1–T3, the voltage at circuit point 423 rises to form a ramp as capacitor 422 discharges. At time T3 the charge carriers in the base region of transistor 344 are exhausted and the base current drops to zero. Transistor 344 becomes nonconductive, initiating the retrace interval. The current flowing in deflection winding 350 and in winding 324d flows in a resonant manner in retrace capacitor 348, producing a high retrace voltage in the interval T3–T11 as illustrated by V348 of FIG. 4c.

During the first half T3–T5 of retrace interval T3–T11, the high retrace voltage causes the current in the deflection winding to decrease towards zero, and also reduces current I322 towards zero. In normal operation, current I322 in inductor 322 reaches zero near time T5 of the center of retrace. This also reduces the current in regulator switch transistor 328 to zero, notwithstanding that the base-emitter junction is biased for conduction.

During the last half T5–T11 of the retrace interval, the retrace voltage causes an increasing current through deflection winding 350 as current is stored therein, and also causes an increasing current to flow through inductor 322 and diode 330 as energy is transferred from deflection circuit 340 to inductor 322 and source 310.

At a time T7 illustratively within the last half T5–T11 of the retrace interval but which may be adjusted as required to any appropriate time, ramp voltage V423 becomes equal to the forward base-emitter offset voltage of transistor 426. Transistor 426 again becomes conductive, and its collector voltage V427 decreases as illustrated in FIG. 4e and maintains transistor 416 deenergized. The negative transition of V427 is coupled through capacitor 430 to circuit point 431 at the base of transistor 434, rendering it nonconductive. The collector voltage of transistor 434 rises as illustrated by VC434 of FIG. 4h. Darlington transistor 438 becomes conductive, and its collector voltage drops sharply as illustrated by VC438 of FIG. 4i. This change in voltage is applied to the base of transistor 328 in such a manner as to reverse-bias it.

In the succeeding interval T7–T9, charge carriers are extracted from the base region of transistor 328, but transistor 328 continues able to conduct. A ramp voltage V431 is generated at circuit point 431 as capacitor 430 discharges through resistor 432 and under the influence of reference voltage generator 333.

At time T9, all the charge carriers are extracted from the base region of transistor 328 and it becomes unable to conduct until again forward-biased. Since conduction of switch 326 in normal operation is through diode 330 after time T5 of the center of the retrace interval, rendering transistor 328 unable to conduct beginning at time T9 makes no difference in the operation of the circuit. In the interval between time T9 at which transistor 328 is rendered incapable of conduction and time T11 of the end of the retrace interval, the retrace voltage continues to decrease. At some time before time T11, the retrace voltage becomes equal to the voltage across storage capacitor 341, and the voltage applied across winding 324d becomes zero and then reverses, as described in conjunction with FIG. 1, resulting in a change in the direction of energy flow.

At time T11 the retrace interval ends and the trace interval begins as damper diode 346 begins to conduct a decreasing ramp current through deflection winding 350. Diode 330 of regulator switch 326 also conducts a decreasing current through winding 322 in the interval T11–T13 as inductor 322 gives up energy to unregulated source 310 and to capacitor 341. At time T13, the current in inductor 322 reaches zero as illustrated in FIG. 4d, and regulator switch 326 thereafter remains opened until the next following interval in which base drive is applied to the transistor 328. With switch 326 open, voltage V322 and 324a across the series combination of inductor 322 and winding 324a decreases to zero as illustrated in FIG. 4k. As illustrated, the waveform of FIG. 4k displays transients in the interval immediately after turn-off time T13.

At a time T15 before the center of the trace interval, sync signal generator 408 produces a negative transition which is coupled through transformer 366 to the base of transistor 344 to forward-bias the transistor and render it conductive. Near time T15, switch 326 remains nonconductive and ramp voltage V431 continues to be developed at circuit point 431 as capacitor 430 charges. At a time T17 increasing ramp voltage V431 at circuit point 431 becomes equal to the base-emitter offset voltage of transistor 434. Transistor 434 again becomes conductive, its collector voltage VC434 decreases and renders transistor 438 nonconductive. The collector voltage VC428 of transistor 438 makes a positive excursion which forward-biases transistor 326.

Current begins to flow through transistor 328 and through inductor 322 after time T17. Thus, the period during which no energy is transferred between regulated source 310, inductor 322 and deflection circuit 340 ends at time T17. The moment at which time T17 occurs during each recurrent regulation cycle may vary from time to time depending upon the amount of energy extracted from the circuit by the kinescope, and also dependent upon the magnitude of the unregulated direct voltage.

Energy continues to be transferred to inductor 322 and by way of transformer 324 to capacitor 341 until slightly after the next following time T3 when the series of energy transfers begins which result in a net transfer to deflection circuit 340 for compensating for circuit losses.

Other embodiments of the invention will be obvious to those skilled in the art. For example, switch 326 may be connected anywhere in the series path including inductor 322 and winding 324a. The ultor power may be extracted from a separate transformer coupled in parallel with deflection winding 350. The amount of energy circulating in the system may be sensed in other manners than by the use of reference voltage generators 33 and 333, as by sensing the voltage across capacitors 52 or 352. Also, the form of the control circuit required to produce appropriate pulses for control of SCR 28 or transistor 328 is not critical. The inductance provided by inductors 22 and 322 may be provided instead by leakage inductance associated with the primary windings of transformers 24 and 324, respectively.

What is claimed is:

1. A regulated television deflection apparatus adapted to be energized by and isolated from a source of unregulated direct voltage, comprising:

regulator switch means including a controlled, main, current path and a control electrode;

a transformer including a primary winding serially coupled with said main current path and with said source for coupling energy from said source to said primary winding when said main current path is conductive in a first direction, said transformer further including a secondary winding conductively isolated from said primary winding;

a deflection winding coupled across said secondary winding for forming a path for the bidirectional flow of current therebetween;

a trace switch coupled in parallel with said deflection winding and operated at the horizontal rate for promoting the flow of deflection current in said deflection winding during trace and retrace intervals of each deflection cycle; and control means coupled to said control electrode and to an energy sensing point on the apparatus for making said main current path conductive at a controllable instant during said trace interval that varies as said unregulated direct voltage varies for maintaining the voltage at said point substantially constant, said main current path remaining conductive after said controllable instant until the occurrence of said retrace interval when the voltage across said deflection winding is applied to said secondary winding for inducing a current in said primary winding that reduces the current in said main current path to zero during said retrace interval and thereafter said main current path is substantially nonconductive in said first direction until the reoccurrence of said controllable instant within the subsequent trace interval.

2. An apparatus according to claim 1 wherein said regulator switch means comprises a semiconductor junction adapted for easy conduction of current having a polarity opposite to that of said controlled current path for reducing the peak reverse voltage across said main current conducting path during said retrace interval.

3. An apparatus according to claim 2 further comprising an inductance serially coupled with said regulator switch means.

4. An apparatus according to claim 2 wherein said transformer primary winding has leakage inductance effectively in series with said regulator switch means.

5. An apparatus according to claims 3 or 4 wherein said regulator switch means comprises a transistor.

6. An apparatus according to claim 5 further comprising a storage capacitor serially coupled with said secondary winding.

7. An apparatus according to claim 1 wherein said regulator switch means comprises a transistor, said control electrode comprises the transistor base electrode and said controlled current path comprises the collector-to-emitter path of said transistor, said apparatus further including a diode paralleling said transistor collector-to-emitter path, said diode conducting current from said primary winding during said retrace interval when transistor is turned off.

8. A regulated television deflection apparatus adapted to be energized by and isolated from a source of unregulated direct voltage, comprising:

regulator switch means comprising a silicon controlled rectifier having a controlled, main, current path and a control electrode;

a transformer including a primary winding serially coupled with said main current path and with said source for coupling energy from said source to said primary winding when said regulator switch means is on, said transformer further including a secondary winding conductively isolated from said primary winding;

a deflection winding coupled across said secondary winding for forming a path for the bidirectional flow of current therebetween;

a trace switch coupled in parallel with said deflection winding and operated at the horizontal rate for promoting the flow of deflection current in said deflection winding during trace and retrace intervals of each deflection cycle, wherein the voltage across said deflection winding during said retrace interval is coupled to said primary winding for reducing the current in said main current path to zero during said retrace interval thereby turning said regulator switch means off; and control means coupled to said control electrode and to an energy sensing point on the apparatus for varying the time during said trace interval at which said regulator switch means is turned on as said unregulated direct voltage varies for maintaining the voltage at said point substantially constant.

9. A regulated television deflection apparatus adapted to be energized by and isolated from a source of unregulated direct voltage, comprising:

regulator switch means comprising a silicon controlled rectifier having a controlled, main, current path comprising the anode-to-cathode path thereof and a control electrode;

a diode paralleling said anode-to-cathode path;

a transformer including a primary winding serially coupled with said main current path and with said source for coupling energy from said source to said primary winding when said regulator switch means is on, said transformer further including a secondary winding conductively isolated from said primary winding;

a deflection winding coupled across said secondary winding for forming a path for the bidirectional flow of current therebetween;

a trace switch coupled in parallel with said deflection winding and operated at the horizontal rate for promoting the flow of deflection current in said deflection winding during trace and retrace intervals of each deflection cycle, wherein the voltage across said deflection winding during said retrace interval is coupled to said primary winding for reducing the current in said main current path to zero during said retrace interval thereby turning said regulator switch means off, said diode conducting current from said primary winding during said retrace interval when said silicon controlled rectifier is turned off; and control means coupled to said control electrode and to an energy sensing point on the apparatus for varying the time during said trace interval at which said regulator switch means is turned on as said unregulated direct voltage varies for maintaining the voltage at said point substantially constant.

10. An apparatus according to claim 9 including first and second capacitances, said first capacitance serially coupled with said deflection winding across said trace switch and said second capacitance serially coupled with said transformer secondary winding across said trace switch and including a deflection start-up circuit comprising a source of voltage conductively isolated from said primary winding and available upon initial apparatus turn-on and means coupled to said isolated, available voltage source and to one of said first and second capacitances for charging said one capacitance from said isolated, available voltage source.

11. An apparatus according to claim 10 including means for decoupling said start-up circuit from said one capacitance after the initial turn-on interval.

12. A regulated deflection circuit with a start-up arrangement, comprising:
 a deflection winding;
 a trace switch coupled to said deflection winding and responsive to a deflection rate switching signal for generating deflection current in said deflection winding within a deflection cycle, a retrace pulse voltage being developed across said deflection winding during a retrace interval of said deflection cycle;
 a storage capacitor;
 a transformer having first and second windings conductively isolated from each other, said second winding series coupled with said storage capacitor across said trace switch;
 a source of input voltage;
 a regulator switch for applying said input voltage to said transformer first winding to store energy in said transformer;
 a control circuit coupled to said regulator switch and responsive to a deflection circuit energy level for turning on said regulator switch at a controlled instant within a trace interval of said deflection cycle, said instant varying with variations in said deflection circuit energy level to control the amount of stored energy in said transformer, said stored energy being transferred to said deflection circuit during said retrace interval, said retrace pulse voltage being applied to said transformer second winding to produce a decreasing magnitude current in said transformer first winding that turns off said regulator switch during said retrace interval;
 a source of voltage conductively isolated from said transformer first winding and available during an initial turn-on interval; and
 start-up means for charging said storage capacitor from said isolated, available voltage source to develop a deflection circuit operating voltage during said initial turn-on interval, the subsequent operation of said trace switch increasing the direct voltage across said storage capacitor.

13. A circuit according to claim 12 wherein said start-up means includes a diode series coupled in the charging current path of said storage capacitor, said direct voltage across said capacitor reverse biasing said diode.

14. A circuit according to claim 13 wherein said regulator switch comprises a silicon controlled rectifier.

15. A circuit according to claim 14 including a diode antiparalleling said silicon controlled rectifier.

16. A circuit according to claim 15 including a high voltage winding of said transformer coupled to a rectifier for generating an ultor voltage.

* * * * *